(12) United States Patent
Hsu et al.

(10) Patent No.: US 8,536,660 B2
(45) Date of Patent: Sep. 17, 2013

(54) HYBRID PROCESS FOR FORMING METAL GATES OF MOS DEVICES

(75) Inventors: Peng-Fu Hsu, Hsin-Chu (TW); Yong-Tian Hou, Singapore (SG); Ssu-Yi Li, Jhubei (TW); Kuo-Tai Huang, Hsin-Chu (TW); Mong Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 844 days.

(21) Appl. No.: 12/047,113

(22) Filed: Mar. 12, 2008

(65) Prior Publication Data

US 2009/0230479 A1 Sep. 17, 2009

(51) Int. Cl.
*H01L 21/02* (2006.01)

(52) U.S. Cl.
USPC .................................. 257/410; 257/E29.137

(58) Field of Classification Search
USPC .............. 257/369, 371, 374, 410, 411, 412, 257/E27.064, E27.067, E27.108, E29.128, 257/E29.137
See application file for complete search history.

(56) References Cited

U.S. PATENT DOCUMENTS

| | | | |
|---|---|---|---|
| 4,974,056 A * | 11/1990 | Brodsky et al. ............. 257/751 |
| 6,089,695 A | 7/2000 | Takagi et al. |
| 6,323,115 B1 | 11/2001 | Tanabe et al. |
| 6,373,111 B1 * | 4/2002 | Zheng et al. ................ 257/407 |
| 6,696,345 B2 | 2/2004 | Chau et al. |
| 6,727,129 B1 | 4/2004 | Nakajima |
| 6,794,234 B2 | 9/2004 | Polishchuk et al. |
| 6,831,310 B1 | 12/2004 | Mathew et al. |
| 6,855,641 B2 | 2/2005 | Ryu et al. |
| 6,936,508 B2 | 8/2005 | Visokay et al. |
| 6,998,686 B2 | 2/2006 | Chau et al. |
| 7,157,378 B2 | 1/2007 | Brask et al. |
| 7,160,767 B2 | 1/2007 | Brask et al. |

(Continued)

FOREIGN PATENT DOCUMENTS

| | | |
|---|---|---|
| CN | 1667808 A | 9/2005 |
| CN | 1274018 C | 9/2006 |
| CN | 1992273 A | 7/2007 |

OTHER PUBLICATIONS

Chudzik, M., et al., "High-Performance High-k/Metal Gates for 45nm CMOS and Beyond with Gate-First Processing," Symposium on VLSI Technology Digest of Technical Papers, 2007, pp. 194-195.

(Continued)

*Primary Examiner* — Vongsavanh Sengdara
(74) *Attorney, Agent, or Firm* — Slater & Matsil, L.L.P.

(57) ABSTRACT

A semiconductor structure includes a first MOS device including a first gate, and a second MOS device including a second gate. The first gate includes a first high-k dielectric over a semiconductor substrate; a second high-k dielectric over the first high-k dielectric; a first metal layer over the second high-k dielectric, wherein the first metal layer dominates a work-function of the first MOS device; and a second metal layer over the first metal layer. The second gate includes a third high-k dielectric over the semiconductor substrate, wherein the first and the third high-k dielectrics are formed of same materials, and have substantially a same thickness; a third metal layer over the third high-k dielectric, wherein the third metal layer and the second metal layer are formed of same materials, and have substantially a same thickness; and a fourth metal layer over the third metal layer.

17 Claims, 11 Drawing Sheets

(56) References Cited

U.S. PATENT DOCUMENTS

| | | | |
|---|---|---|---|
| 7,253,053 B2 * | 8/2007 | Eppich et al. | 438/244 |
| 7,432,567 B2 | 10/2008 | Doris et al. | |
| 2002/0079548 A1 * | 6/2002 | Hu | 257/412 |
| 2003/0057499 A1 | 3/2003 | Yamamoto | |
| 2003/0128384 A1 | 7/2003 | Nelson et al. | |
| 2004/0066535 A1 | 4/2004 | Oyumi | |
| 2004/0245578 A1 | 12/2004 | Park et al. | |
| 2004/0256679 A1 | 12/2004 | Hu | |
| 2005/0082605 A1 | 4/2005 | Akasaka | |
| 2005/0112875 A1 | 5/2005 | Lander et al. | |
| 2005/0157138 A1 | 7/2005 | Silverbrook et al. | |
| 2005/0260806 A1 | 11/2005 | Chang et al. | |
| 2006/0121678 A1 | 6/2006 | Brask et al. | |
| 2006/0166424 A1 | 7/2006 | Schaeffer, III et al. | |
| 2007/0018244 A1 * | 1/2007 | Hung et al. | 257/337 |
| 2007/0075351 A1 | 4/2007 | Schulz et al. | |
| 2007/0105317 A1 | 5/2007 | Nakajima | |
| 2007/0138559 A1 | 6/2007 | Bohr | |
| 2007/0272975 A1 * | 11/2007 | Schaeffer et al. | 257/327 |
| 2008/0099851 A1 * | 5/2008 | Hsu et al. | 257/369 |
| 2008/0173947 A1 | 7/2008 | Hou et al. | |
| 2008/0188044 A1 | 8/2008 | Hsu et al. | |
| 2009/0039433 A1 | 2/2009 | Yang et al. | |
| 2009/0152636 A1 * | 6/2009 | Chudzik et al. | 257/369 |

OTHER PUBLICATIONS

Tateshita, Y., et al., "High-Performance and Low-Power CMOS Device Technologies Featuring Metal/High-k Gate Stacks with Uniaxial Strained Silicon Channels on (100) and (110) Substrates," IEEE International Electron Devices Meeting, 2006, 4 pages, IEEE.

Hou, Y. T., et al., "High Performance Tantalum Carbide Metal Gate Stacks for nMOSFET Application," IEEE International Electron Devices Meeting, IEDM Technical Digest, Dec. 2005, pp. 31-34, Washington, D.C., United States.

Hsu, P. F., et al., "Advanced Dual Metal Gate MOSFETs with High-*k* Dielectric for CMOS Application," Symposium in VLSI Technology, Digest of Technical Papers, 2006, pp. 11-12, IEEE, Honolulu, Hawaii, United States.

\* cited by examiner

HYBRID PROCESS FOR FORMING METAL GATES OF MOS DEVICES

CROSS-REFERENCE TO RELATED APPLICATION

This application relates to the following commonly assigned U.S. patent application: application Ser. No. 11/552,704, filed Oct. 25, 2006, entitled "Semiconductor Devices with Dual-Metal Gate Structures and Fabrication Methods Thereof," which patent application is incorporated herein by reference.

TECHNICAL FIELD

This invention relates generally to semiconductor devices, and more particularly to structures of metal-oxide-semiconductor (MOS) devices and manufacturing methods for forming the same.

BACKGROUND

Metal-oxide-semiconductor (MOS) devices are basic building elements in integrated circuits. A conventional MOS device typically has a gate electrode comprising polysilicon doped with p-type or n-type impurities, using doping operations such as ion implantation or thermal diffusion. It is preferred to adjust the work function of the gate electrode to the band-edge of the silicon; that is: for an NMOS device, adjusting the work function close to the conduction band, and for a PMOS device, adjusting the work function close to the valence band. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when applied electrical fields sweep away carriers from regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The use of thin gate dielectrics tends to make the carrier depletion effect worse. With thin gate dielectrics, the depletion layer in the polysilicon gate becomes more significant in thickness when compared to the thickness of the thin gate dielectrics, and thus device performance degradation worsens. As a result, the carrier depletion effect in the gate electrodes limits device scalability by imposing a lower bound on how much the effective gate dielectric thickness can be reduced.

The poly depletion effect was previously solved by forming metal gate electrodes or metal silicide gate electrodes, wherein the metallic gates used in NMOS devices and PMOS devices also preferably have band-edge work functions. Currently, materials suitable for forming gate electrodes of NMOS devices, such as TaC, have been found. However, for PMOS devices, even though metallic materials having band-edge work functions have been found, these materials have poor thermal stability. When exposed to the high temperatures in the front-end-of-line processes, the work functions of these metallic materials shift, for example, toward the mid-gap level. The performance of the resulting PMOS devices is thus adversely affected.

Existing processes for forming dual-metal complementary MOS (CMOS) devices include two main categories, gate-first approach and gate-last approach. Both approaches have advantageous and disadvantageous features. In a typical gate-first approach, two metal layers having different work functions are separately formed in PMOS and NMOS regions. The metal layers are then patterned to form gate electrodes. Other components of MOS devices, such as spacers, lightly doped source/drain (LDD) regions, source/drain regions, silicides, and contact etch stop layers are then formed. This process is relatively simple, and the resulting contact etch stop layers are continuous, so that they can effectively apply stresses. However, since the metal gates are formed before the formation and the activation of LDD regions and source/drain regions, they suffer from high thermal budgets, and the work functions of PMOS devices may shift. In addition, if composite metal layers are used, the oxygen in the composite metal layer may be released under the thermal budgets, and cause interfacial layer re-growth. Further, patterning metal layers by etching is relatively difficult, particularly for metals used for the PMOS devices.

Gate-last approach, on the other hand, typically includes the steps of forming dummy gates for both PMOS and NMOS devices. LDD regions, gate spacers, source/drain regions, and contact etch stop layers are then formed. The dummy gates of PMOS and NMOS devices are then removed, and metals with different work functions are then filled into the openings for PMOS and NMOS devices. In the gate-last approach, metal gates of PMOS devices and NMOS devices both take the advantage of low thermal budgets since they are formed after the formation and activation of LDD regions and source/drain regions. However, the process is complex. In addition, in the cases wherein the formation of high-k dielectrics also uses gate-last approach, the quality of the high-k dielectrics was often not satisfactory. Besides, forming high-k dielectrics on sidewalls of the openings will adversely increase the fringing capacitance between the gate and nearby features, such as source/drain regions and contacts.

Accordingly, what is needed in the art is a semiconductor structure and respective formation methods that may incorporate dual metal gates thereof to take advantage of the benefits associated with band-edge work functions while at the same time overcoming the deficiencies of the prior art.

SUMMARY OF THE INVENTION

In accordance with one aspect of the present invention, a semiconductor structure includes a first MOS device including a first gate, and a second MOS device including a second gate. The first gate includes a first high-k dielectric over a semiconductor substrate; a second high-k dielectric over the first high-k dielectric; a first metal layer over the second high-k dielectric, wherein the first metal layer dominates a work-function of the first MOS device; and a second metal layer over the first metal layer. The second gate includes a third high-k dielectric over the semiconductor substrate, wherein the first and the third high-k dielectrics are formed of same materials, and have substantially a same thickness; a third metal layer over the third high-k dielectric, wherein the third metal layer and the first metal layer are formed of same materials, and have substantially a same thickness; and a fourth metal layer over the third metal layer.

In accordance with another aspect of the present invention, a semiconductor structure includes a first MOS device including a first gate, and a second MOS device including a second gate. The first gate includes a first high-k dielectric over a semiconductor substrate; a second high-k dielectric over the first high-k dielectric, wherein the first and the second high-k dielectrics are formed of different materials; a first metal layer over the second high-k dielectric, wherein the first metal layer has a thickness great enough for dominating a work-function of the first MOS device; a second metal layer over the first metal layer, wherein the first and the second metal layers are formed of different materials; and a third metal layer over the second metal layer, wherein the third metal layer has a work function close to a valence band of silicon. The second gate includes the first high-k dielectric over the semiconductor substrate; the second metal layer over the first high-k dielectric, wherein the second metal layer in the second gate has a bottom surface lower than a bottom surface of the second metal layer in the first gate; and the third metal layer over the second metal layer.

In accordance with yet another aspect of the present invention, a semiconductor structure includes a semiconductor substrate; a first high-k dielectric over the semiconductor substrate; a second high-k dielectric over the first high-k dielectric, wherein the first and the second high-k dielectrics include different materials; a first metal layer over the second high-k dielectric, wherein the first metal layer has a mid-gap work function; a polysilicon layer over the first metal layer; and a second metal layer over the first metal layer.

In accordance with yet another aspect of the present invention, a method for forming a semiconductor structure includes providing a semiconductor substrate; forming a first MOS device including a first gate, and forming a second MOS device including a second gate. The step of forming the first gate includes forming a first high-k dielectric over the semiconductor substrate; forming a second high-k dielectric over the first high-k dielectric, wherein the first and the second high-k dielectrics are formed of different materials; forming a first metal layer over the second high-k dielectric, wherein the first metal layer has a thickness great enough for dominating a work-function of the first MOS device; and forming a second metal layer over the first metal layer, wherein the first and the second metal layers are formed of different materials. The step of forming the second gate includes forming a third high-k dielectric over the semiconductor substrate, wherein the first and the third high-k dielectrics include same materials, and have substantially a same thickness; forming a third metal layer over the third high-k dielectric, wherein the third metal layer and the second metal layer include same materials, and have substantially a same thickness; and forming a fourth metal layer over the third metal layer, wherein the third and the fourth metal layers are formed of different materials.

In accordance with yet another aspect of the present invention, a method for forming a semiconductor structure includes providing a semiconductor substrate having a first MOS device region and a second MOS device region; blanket forming a first high-k dielectric layer over the semiconductor substrate; blanket forming a second high-k dielectric layer over the first high-k dielectric layer, wherein the first and the second high-k dielectric layers are formed of different materials; removing the second high-k dielectric layer from the second MOS device region; blanket forming a first metal layer over the first and the second high-k dielectric layers, wherein the first metal layer has a thickness great enough for dominating a work-function of a respective MOS device; forming a polysilicon layer over the first metal layer; patterning the first and the second high-k dielectric layers, the first metal layer, and the polysilicon layer to form a first gate stack in the first MOS device region, and a second gate stack in the second MOS device region; forming gate spacers on sidewalls of the first and the second gate stacks; forming an inter-layer dielectric (ILD) over the semiconductor substrate and the first and the second gate stacks; performing a planarization and exposing a top surface of the polysilicon layer; etching the second gate stack until at least an upper portion of the first metal layer is removed to form a first opening; etching the first gate stack until at least an upper portion of the polysilicon layer is removed to form a second opening, wherein the first metal layer in the first gate stack is not etched; blanket forming a second metal layer extending into the first and the second openings; forming a third metal layer to fill remaining portions of the first and the second openings; and performing a planarization to remove portions of the second and the third metal layers over the ILD.

In accordance with yet another aspect of the present invention, a method for forming a semiconductor structure includes providing a semiconductor substrate; forming a first high-k dielectric layer over the semiconductor substrate; forming a second high-k dielectric layer over the first high-k dielectric layer, wherein the first and the second high-k dielectric layers are formed of different materials; forming a first metal layer over the second high-k dielectric layer, wherein the first metal layer has a thickness great enough for dominating a work-function of a respective MOS device; forming a polysilicon layer over the first metal layer; patterning the first and the second high-k dielectric layers, the first metal layer, and the polysilicon layer to form a gate stack; forming a gate spacer on a sidewall of the gate stack; forming an inter-layer dielectric (ILD) over the semiconductor substrate and gate stack; performing a planarization and exposing a top surface of the polysilicon layer; etching the gate stack to form an opening, until at least an upper portion of the polysilicon layer is removed, and wherein the first metal layer is not removed by the etching; forming a second metal layer lining the opening; and forming a third metal layer to fill the opening.

The hybrid method of the present invention provides band-edge work functions for both PMOS and NMOS devices. The stresses applied to the channel regions of PMOS devices are increased due to the adoption of the gate-last approach in PMOS devices. In addition, the threshold voltages of both PMOS and NMOS devices are both reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming hybrid complementary metal-oxide-semiconductor (CMOS) devices with dual metal gates is provided. The method combines gate-first and gate-last approaches to achieve better effects. The intermediate stages of manufacturing a preferred embodiment of the present invention are illustrated. Throughout the various views and illustrative embodiments of the present invention, like reference numbers are used to designate like elements.

Figure 1:
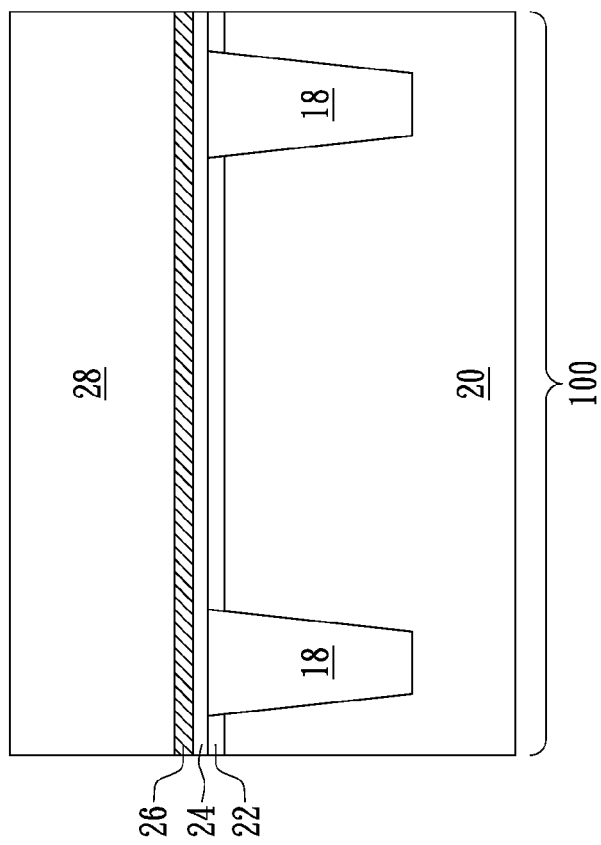
FIGS. 1 through 11 are cross-sectional views of intermediate stages in the manufacturing of an embodiment of the present invention.

Referring to FIG. 1, substrate 20 is provided, which may be formed of commonly used semiconductor materials and structures such as bulk silicon, silicon-on-insulator (SOI), silicon-germanium (SiGe), embedded SiGe (eSiGe), germanium, and the like. Shallow trench isolation regions 18 are formed in substrate 20, and may be used to define NMOS device region 100 and PMOS device region 200. Interfacial layer 22 is formed on substrate 20. Interfacial layer 22 helps buffer substrate 20 and the overlying high-k dielectric layer, and may be formed of chemical oxide, thermal oxide, silicon oxynitride, and the like. In an exemplary embodiment, the nitrogen atomic ratio of interfacial layer 22 is less than about 15 atomic percent.

A first high-k dielectric layer 24 is formed on interfacial layer 22. Preferably, the first high-k dielectric layer 24 has a k value of greater than about 7.0, and may include a metal oxide a silicate of Hf, Al, Zr, combinations thereof, and multi-layers thereof. The thickness of high-k dielectric layer 24 may be between about 1 nm and about 10 nm. One skilled in the art will realize, however, that the dimensions recited throughout the specification are merely examples, and will change with the down-scaling of the formation technology.

A second high-k dielectric layer 26, preferably having a k value greater than about 10.0, is formed on the first dielectric layer 24. The second high-k dielectric layer 26 may include metals such as La, Mg, Ba, Ti, Pb, Zr, and may be in the form of metal oxides, metal alloyed oxides, and combinations thereof. Exemplary materials include $MgO_x$, $BaTi_yO_y$, $Ba Sr_xTi_yO_z$, $PbTi_xO_y$, $PbZr_xTi_yO_z$, and the like. Although high-k dielectric layer 26 is referred to as a dielectric layer, it may actually be formed of pure metals such as La and/or Mg. Preferably, the second high-k dielectric layer 26 has the function of depriving substrate 20 from the oxygen that may be released by the first high-k dielectric layer 24 and/or interfacial layer 22. During the subsequent annealing such as source/drain activations, layer 26 may be turned into metal oxides. The thickness of high-k dielectric layer 26 may be between about 0.3 nm and about 3 nm. The formation methods of dielectric layers 24 and 26 include molecular-beam deposition (MBD), atomic layer deposition (ALD), physical vapor deposition (PVD), and the like. Next, photo resist 28 is formed and patterned, exposing PMOS region 200. The exposed portion of high-k dielectric layer 26 is then removed, leaving high-k dielectric layer 26 in NMOS region 100.

Figure 2:
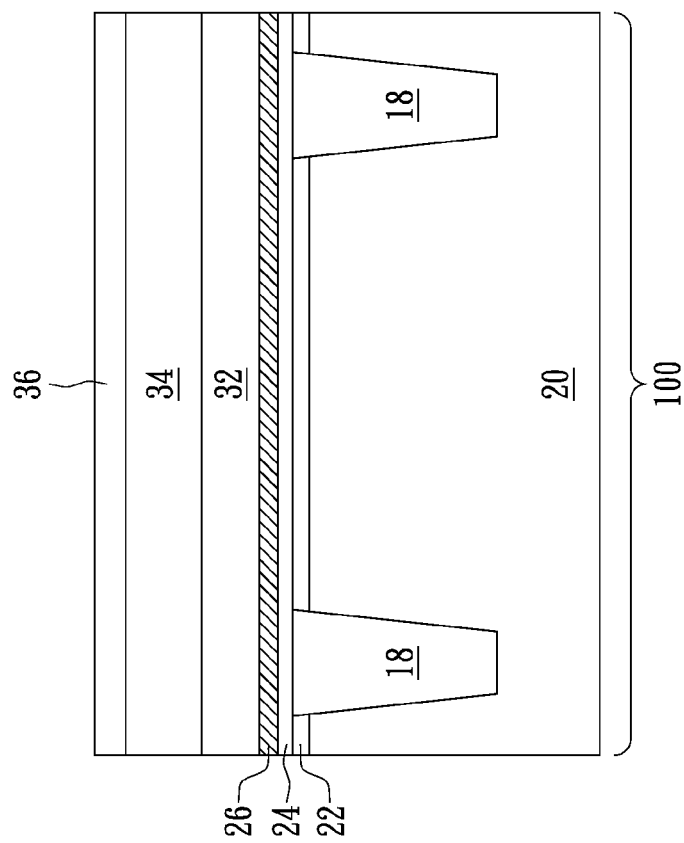

Referring to FIG. 2, thick metal layer 32, polysilicon layer 34, and hard mask layer 36 are sequentially formed. Throughout the description, the term "metal layer(s)" refers to conductive metal-containing layer(s). Preferably, metal layer 32 has a mid-gap work function (in the middle of the conduction and valence bands of silicon), for example, between about 4.1 eV and about 5.2 eV. Alternatively, metal layer 32 may have a conduction band-edge work function (close to the conduction band of silicon, which is about 4.1 eV). The exemplary materials include tantalum or titanium containing materials such as TaC, TaN, TiN, TaAlN, TaSiN, and combinations thereof. These metal-containing materials may be in the form of metal carbides, metal nitrides, or conductive metal oxides. Metal layer 32 determines the work function of the resulting NMOS device, and hence has a thickness greater than the thickness required for dominating the work function of the respective NMOS device. In an exemplary embodiment, the thickness of metal layer 32 is greater than about 3 nm. The formation methods of metal layer 32 include ALD, PVD, metal-organic chemical vapor deposition (MOCVD), and the like.

Polysilicon layer 34 may have a thickness of between about 30 nm and about 100 nm. The functions of polysilicon layer 34 include preventing contamination of metal layer 32, and maintaining the height of the gate stack to a level convenient for the gate formation processes. Polysilicon layer 34 is preferably pre-doped with an n-type impurity. Mask layer 36 is preferably formed of dielectric materials, such as silicon oxide, silicon nitride, silicon oxynitride, silicon carbide, and the like.

Figure 3:
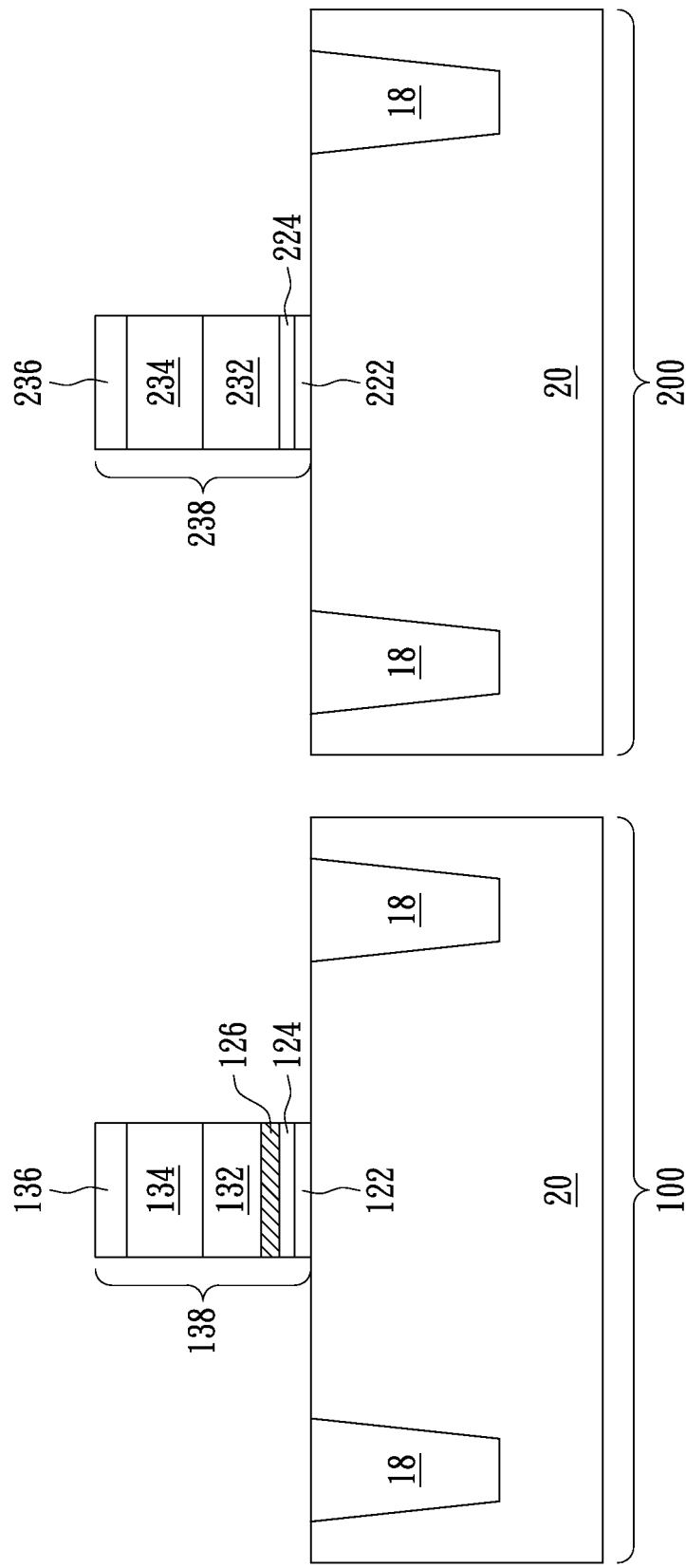

FIG. 3 illustrates the patterning of the previously formed stacked layers, forming gate stack 138 in NMOS region 100, and gate stack 238 in PMOS region 200. Gate stack 138 includes high-k dielectrics 124 and 126, metal layer 132, polysilicon layer 134, and mask layer 136. Gate stack 238 includes high-k dielectric 224, metal layer 232, polysilicon layer 234, and mask layer 236. Interfacial layer 22 is also patterned as layers 122 and 222. For a clear view, interfacial layers 122 and 222 are not shown in subsequent drawings.

Figure 4:
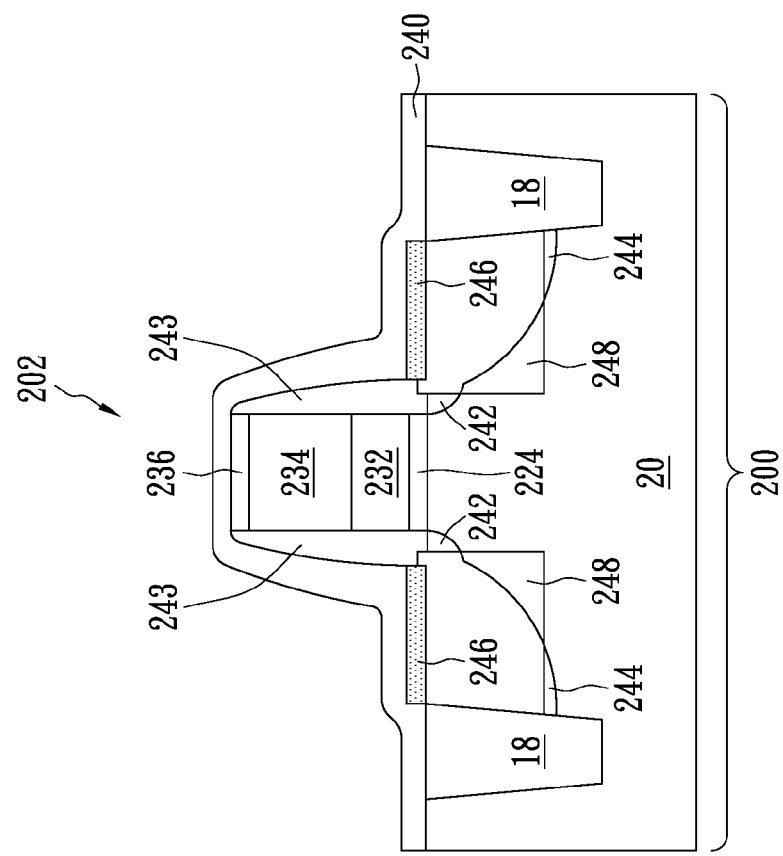
Figure 4:
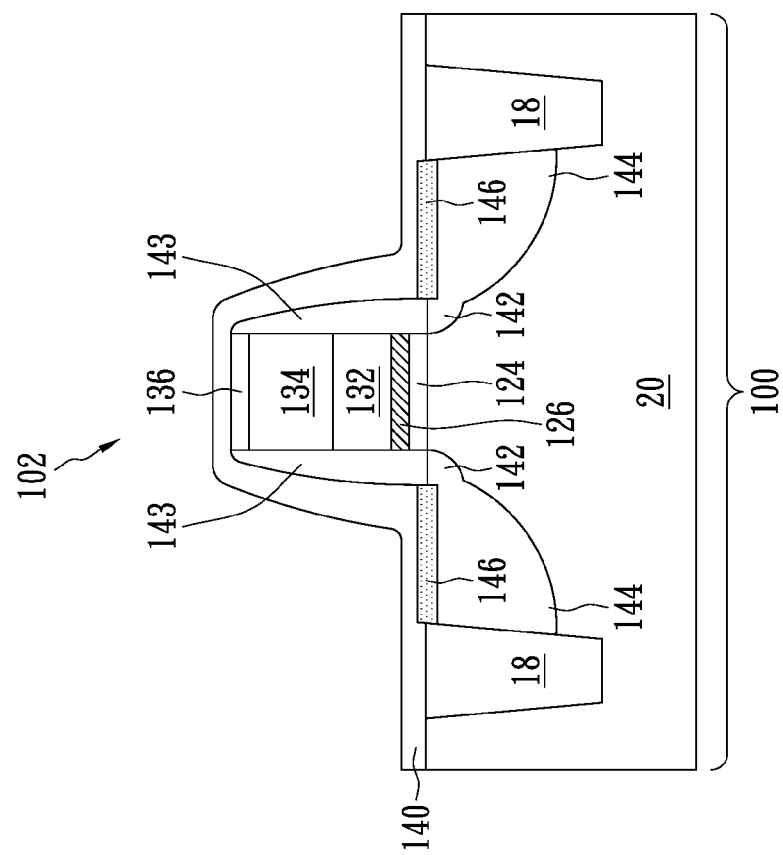

FIG. 4 illustrates the formation of source/drain extension regions 142 and 242, spacers 143 and 243, source/drain regions 144 and 244, and source/drain silicides 146 and 246, which are the components of NMOS device 102 and PMOS device 202, respectively. Contact etch stop layer (CESL) 140, preferably having a tensile stress, is formed over NMOS device 102. Contact etch stop layer (CESL) 240, preferably having a compressive stress, is formed over PMOS device 202. PMOS device 202 may further include stressors 248 (preferably formed of silicon germanium) overlapping portions of source/drain regions 244. The formation methods and materials of the above-discussed regions are known in the art, and thus are not repeated herein.

Figure 5:
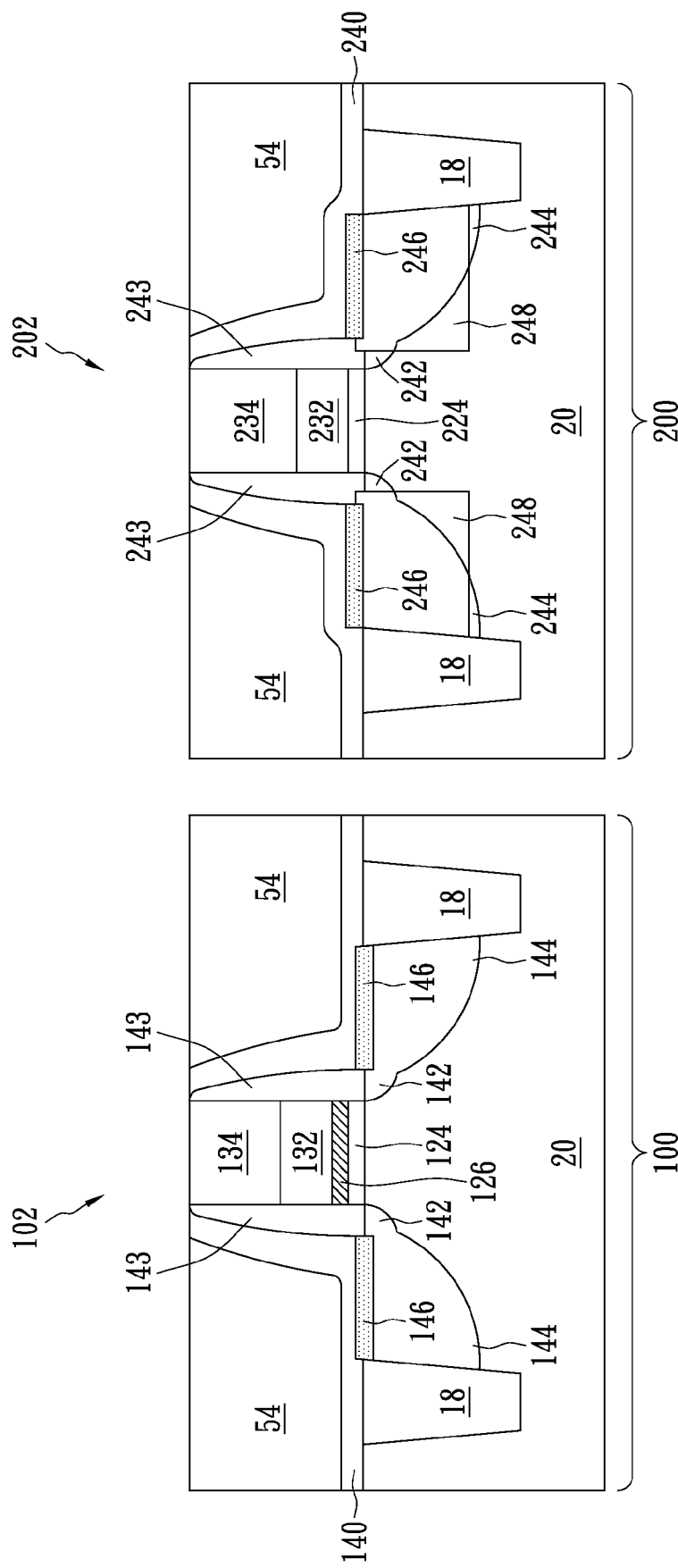

In FIG. 5, inter-layer dielectric (ILD) 54 is blanket formed to a height higher than the top surface of hard masks 136 and 236. In an embodiment, ILD 54 may include carbon-containing oxides. A chemical mechanical polish (CMP) is then performed to remove top portions of ILD 54, and hard masks 136 and 236, hence exposing polysilicon layers 134 and 234.

Figure 6:
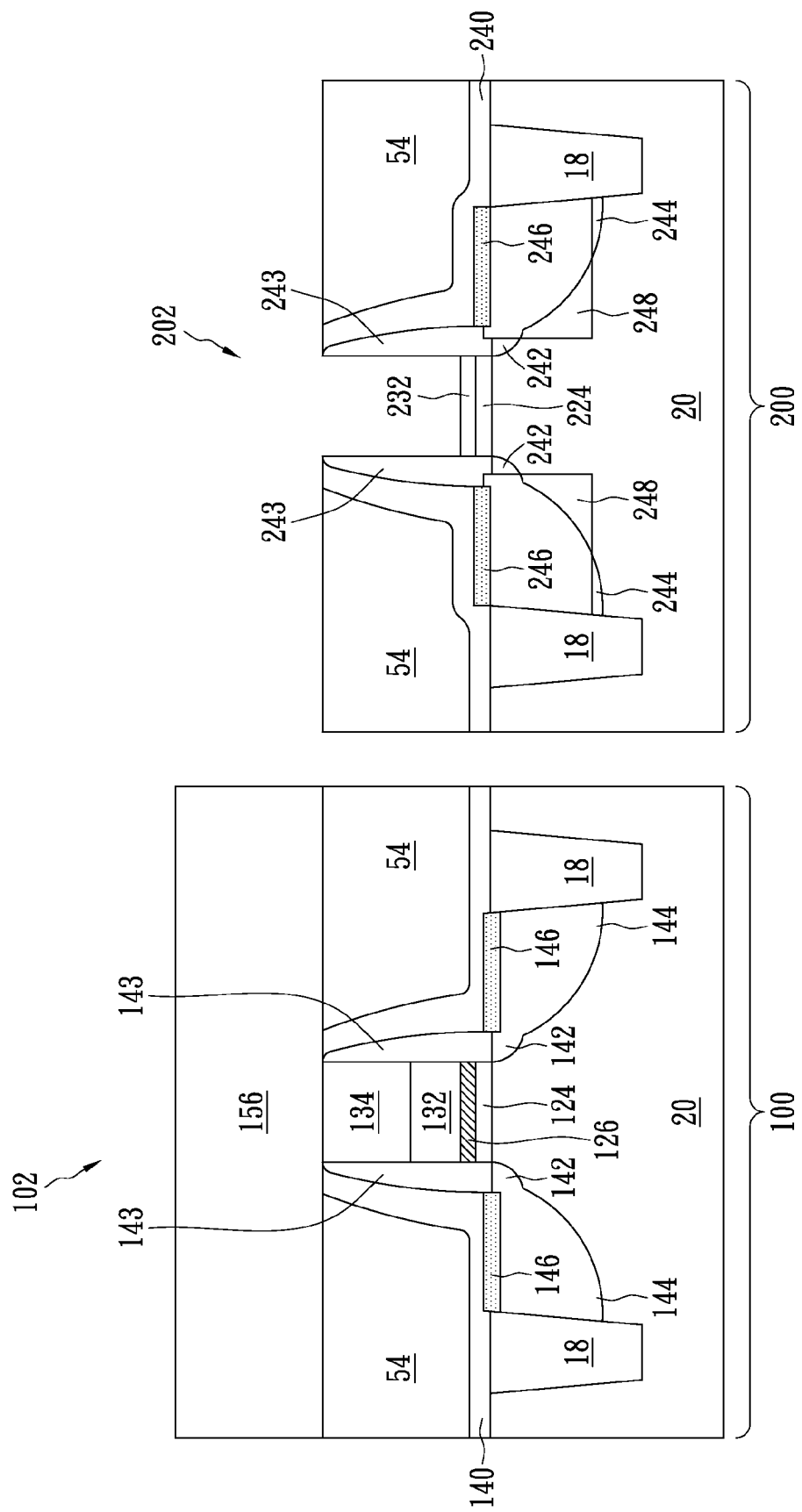

FIG. 6 illustrates the selective removal of the dummy gate including polysilicon layer 234 and at least an upper portion of metal layer 232, which is preformed by applying and patterning photo resist 156 to cover NMOS region 100. The removal of polysilicon layer 234 may be performed using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, ethylenediamine:$C_6H_4(OH)_2$:$H_2O$, $HF:NH_4F:H_2O$, $HF:LNO_3:H_2O$, $KCl:H_2O$, $KOH:H_2O$: $Br_2/I_2$, KOH, $HF:HNO_3:Hac:I_2$:triton, $HF:HNO_3$:Hac, Iodine Etch:Hac, NaI, NaOH, $HF:HNO_3$, $HF:HNO_3:H_2O$, and/or the like. The removal of metal layer 232 may also be performed using either dry or wet etching. In the case dry etching is used, a chlorine containing gas mixture such as $BCl_3$, $Cl_2$, or a combined gas of $N_2$ and $CHF_3$, may be used as the etchant gas. In the case wet etching is used, the wet etching chemicals may include $H_2SO_4:H_2O_2$: $H_2O$(SPM), $H_2O:HF:HNO_3$, $H_2O:HF:H_2O_2$, RCA-1, x % $Br_2$:ethyl acetate (hot), x % $I_2$:MeOH (hot), $HF:CuSO_4NH_4OH:H_2O_2$, $HF:HNO_3:H_2O$, $COOHCOOH:H_2O$, $HF:H_2O_2:LNO_3$, $HF:H_2O$, $HF:HCl:H_2O$, HCl, % KOH, % NaOH, $H_2SO_4$, $CCl_3COOC_2H_5$, HCOOH, $H_3PO_4$, HF, or the like.

In the preferred embodiment, metal layer 232 is fully removed without damaging high-k dielectric layer 224. If, however, the selectivity of the etching is not high enough, a thin metal layer 232 may be left un-etched to protect the underlying high-k dielectric layer 224. In this case, the thickness of the remaining metal layer 232 is preferably less than 2 nm, for example, between about 0.5 nm and about 2 nm, so that it will not substantially affect the work function of PMOS device 202. After the etching of the dummy gate, photo resist 156 is removed. In alternative embodiments, if the selectivity of etching between polysilicon layer 134 and the underlying high-k dielectric layer 224 is high, photo resist 156 is not needed.

Figure 7:
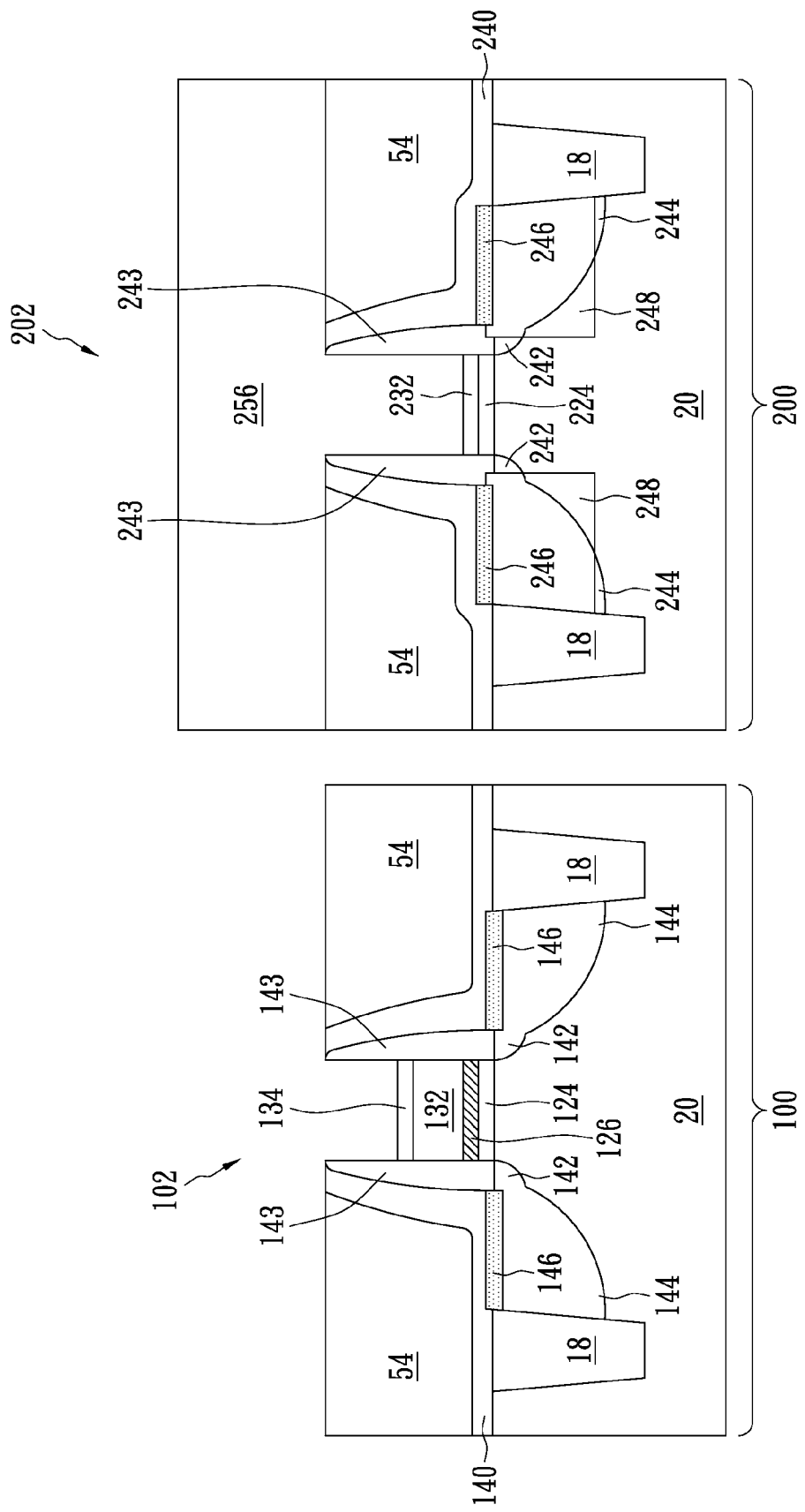

FIG. 7 illustrates the selective removal of the dummy gate in NMOS region 100 including at least an upper portion of polysilicon layer 134, which is preformed by applying and patterning photo resist 256 to cover PMOS region 200. In the preferred embodiment, polysilicon layer 134 is fully removed without damaging the underlying metal layer 132. If, however, the selectivity of the etching is not high enough, a thin polysilicon layer 134 may be left un-etched. In this case, the thickness of the remaining polysilicon layer 134 is preferably less than about 10 nm, and more preferably between about 1 nm and about 5 nm, and even more preferably between about 1 nm and about 2 nm. Photo resist 256 is then removed. In alternative embodiments, if the selectivity of etching between polysilicon layer 134 and the underlying metal layer 132 is high, photo resist 256 is not needed.

Figure 8:
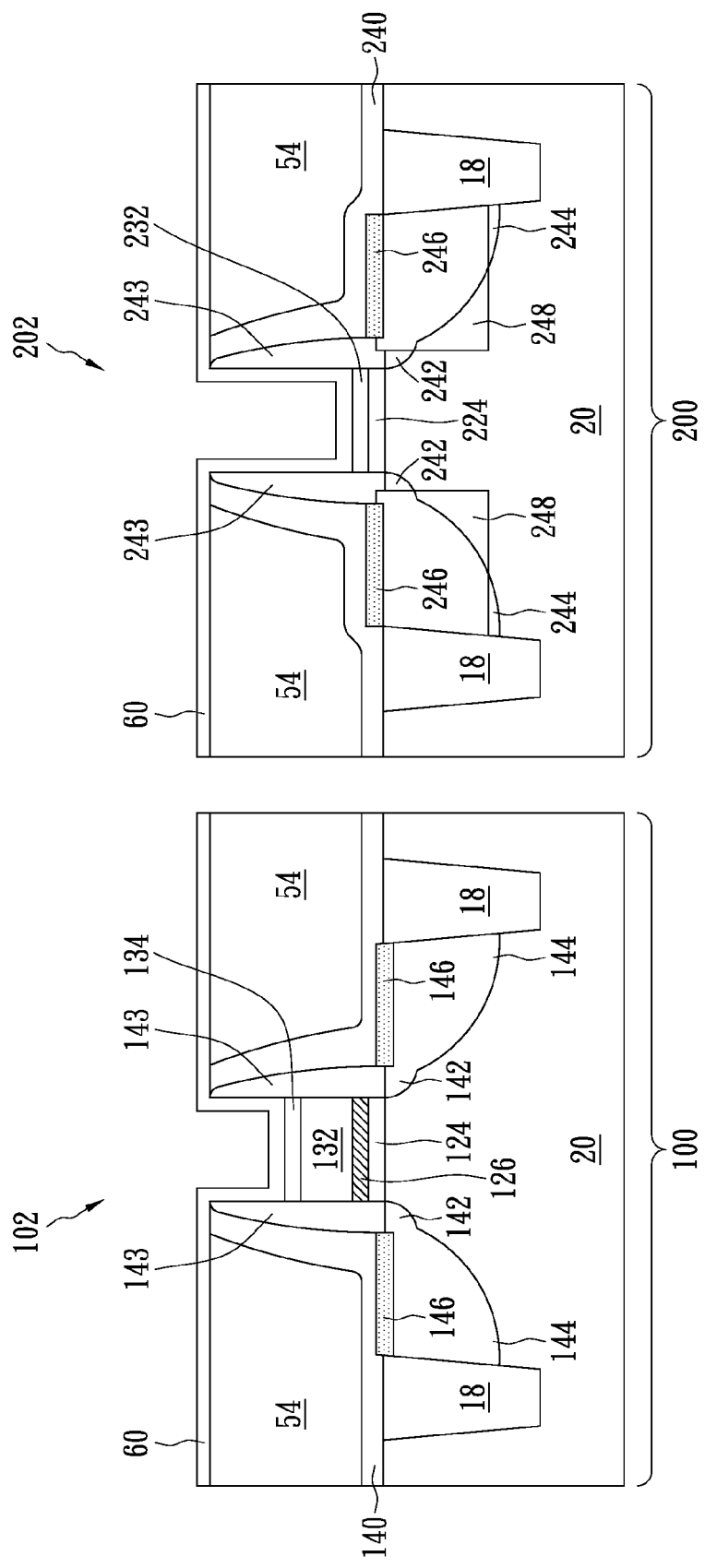

Referring to FIG. 8, thin metal layer 60 is blanket formed. Preferably, metal layer 60 is formed of a material selected from the same category of metal layer 32 (refer to FIG. 2), which material may be a mid-gap material, or a material having a work function close to the conduction band of silicon. Exemplary materials include tantalum or titanium containing materials such as TaC, TaN, TiN, TaAlN, TaSiN, and combinations thereof. The thickness of metal layer 60 is preferably less than about 2 nm. More preferably, metal layer 60 and metal layer 32 are formed of a same material.

Figure 9:
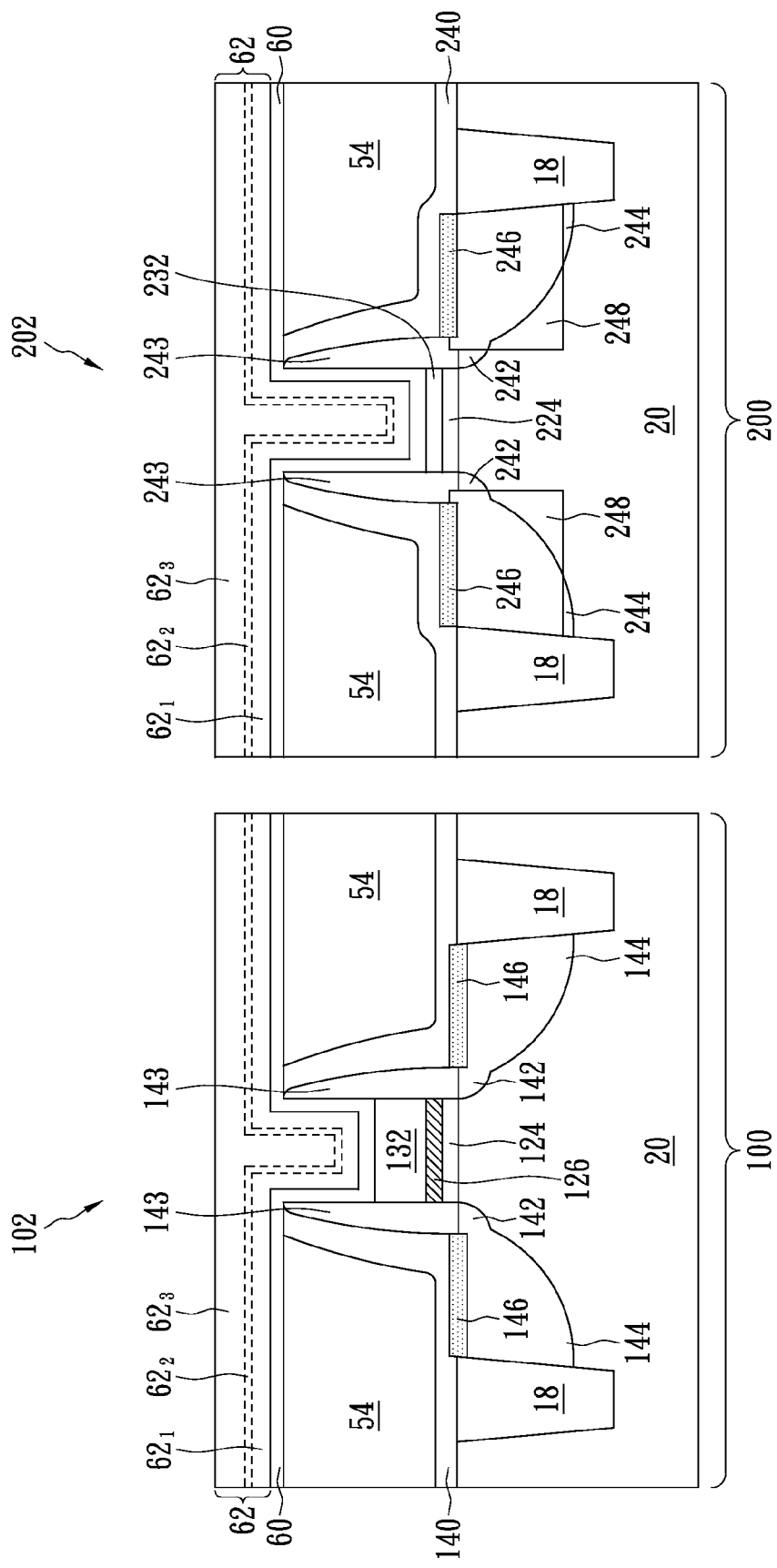

Next, metal layer 62 is formed to fill the remaining openings, as shown in FIG. 9. The exemplary materials include tungsten-containing materials such as tungsten and tungsten nitride, ruthenium-containing materials such as ruthenium and ruthenium oxynitride, molybdenum-containing materials such as molybdenum and molybdenum nitride, and combinations thereof. The preferred work function of metal layer 62 is higher than about 5.0 eV, and more preferably close to the valence band of silicon, which is about 5.2 eV. Metal layer 62 may be formed of PVD or applicable CVD methods.

Optionally, metal layer 62 may include three layers, layer $62_1$ for determining the work function of the resulting PMOS device, layer $62_2$ as a barrier layer, and layer $62_3$ as a re-flow layer. Layer $62_1$ may be formed of essentially the same high work function material as discussed in the preceding paragraph. Barrier layer $62_2$ may include TiN, TaN, Ti, Ta, and the like. The thickness of barrier layer $62_2$ is preferably between about 1 nm and about 5 nm. Re-flow layer $62_3$ may include aluminum, tungsten, and the like, and has a low melting temperature, so that it can be re-flowed to improve the gap-filling ability. The formation methods of re-flow layer $62_3$ include ALD, PVD, MOCVD, and the like. In subsequent steps, re-flow layer $62_3$ is re-flowed.

Figure 10:
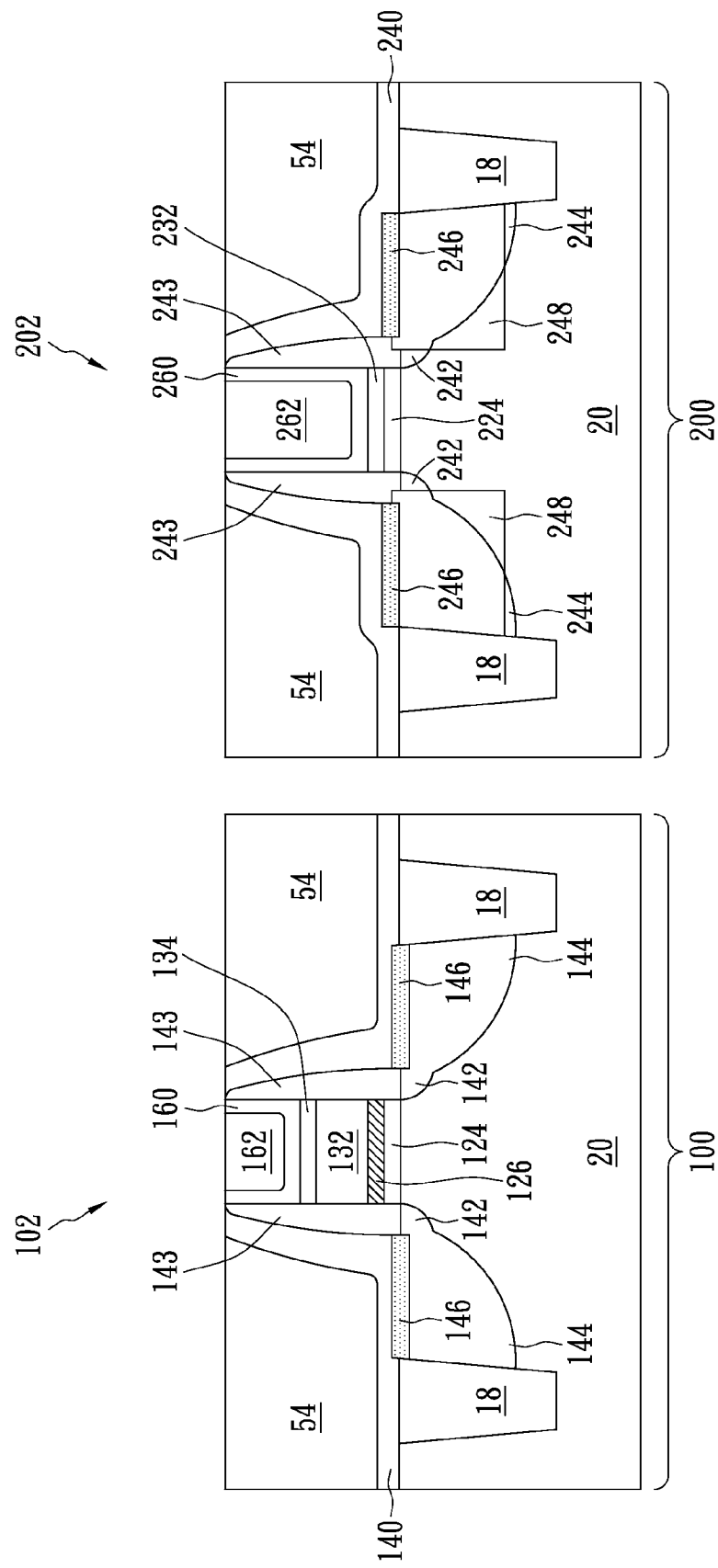
Figure 11:
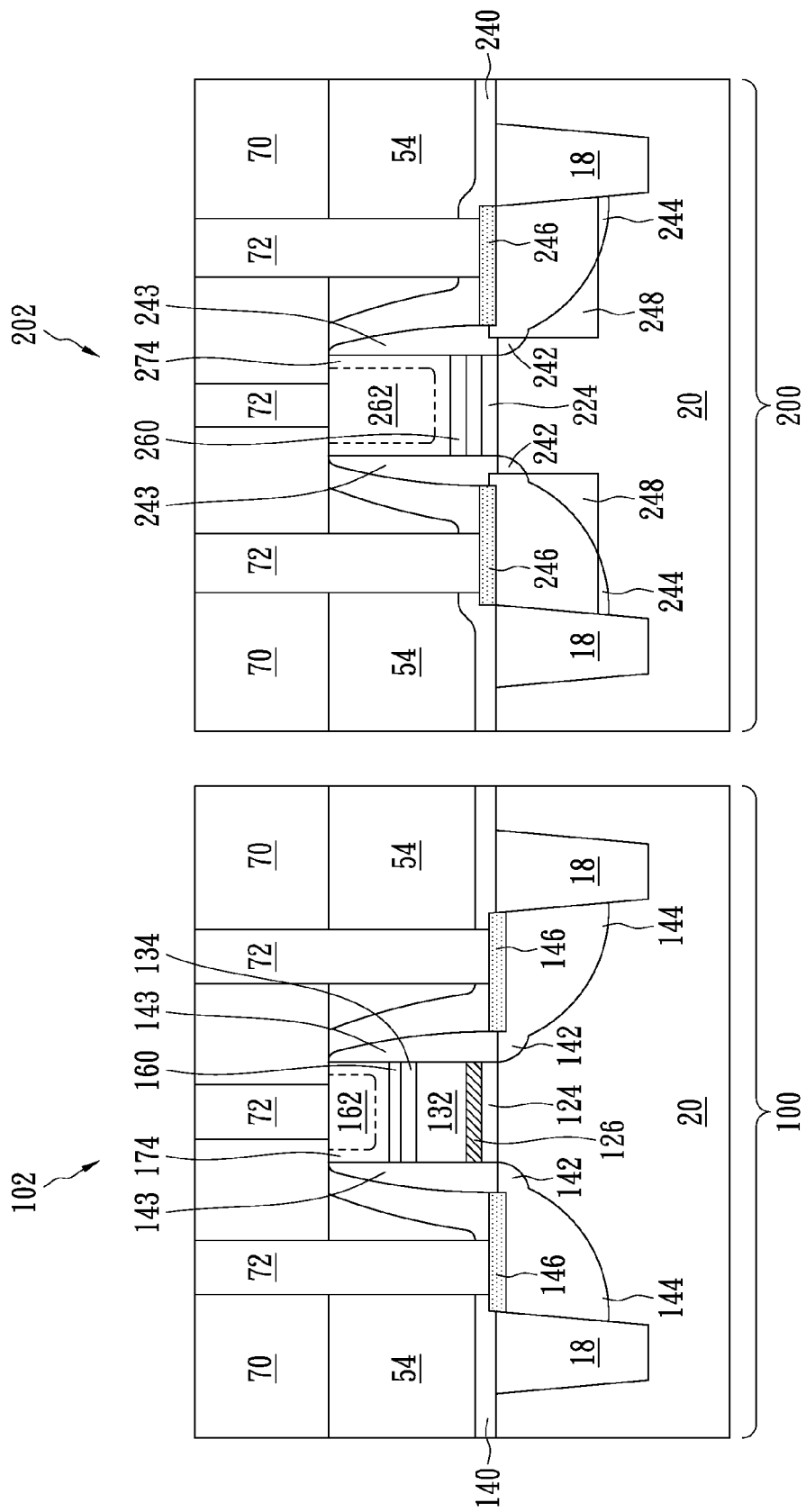

FIG. 10 illustrates the removal of excess metal layers 60 and 62, which may be performed either by a CMP process or a wet etch. The portions of metal layer 60 and 62 over ILD 54 are removed, resulting in metal layers 160 and 260, and metal layers 162 and 262, respectively. The gates of NMOS 102 and PMOS 202 are thus formed. FIG. 11 illustrates a structure after the formation of ILD 70 and contacts 72.

The work function of NMOS device 102 is mainly determined by metal layer 132. In the front-end-of-processes, thermal budgets (such as a source/drain activation) are applied. As a result, high-k dielectric layer 124 and 126 are intermixed, resulting in a charging effect to pull down the work function of metal layer 132 to the conduction band of silicon.

The work function of PMOS device 202 is mainly determined by metal layer 262. Advantageously, metal layer 260 and 262 form an alloy in subsequent thermal annealing, for example, at about 500° C. to 600° C., which annealing may be simultaneously performed with the formation of re-flow layer $62_3$. The work function of the alloy will be even higher than the work function of metal layer 260 alone. As a result, the work function of PMOS device 202 is also close to the valence band of silicon. FIG. 11 schematically illustrates the alloys 174 (as an alloy of metal layers 160 and 162) and 274 (as an alloy of metal layers 260 and 262). Typically, before the thermal annealing, metal layers 160 and 260 are thinner on the sidewalls and thicker at the bottom. Accordingly, there may be remaining portions of metal layers 160 and 260 at the bottoms even after the thermal annealing, although sidewall portions of metal layers 160 and 260 may be fully alloyed.

Experiment results have revealed that the embodiments of the present invention have improved band-edge work functions for both PMOS and NMOS devices, wherein the work functions of NMOS devices are about 4.05 eV to about 4.1 eV, and the work function of PMOS devices are about 5.1 eV. The flat band voltages of the NMOS devices shift toward the conduction band edge, causing the reduction of threshold voltages. Advantageously, the gate-first approach allows NMOS devices to undergo high thermal budget, resulting in the intermixing of high-k dielectric layers 124 and 126. On the other hand, the gate-last approach in PMOS devices allows the flat band of the PMOS devices to be tuned to the valence band edge. Overall, the span of flat band voltages of PMOS and NMOS devices is enlarged to about 900 mV or higher, and the capacitance-equivalent thickness may be as low as about 14.2 Å to about 14.5 Å.

Additionally, the gate-last approach in the PMOS devices causes the increase in the compressive stresses applied on the channel regions of PMOS devices. Simulation results have indicated significant stress increase, sometimes over 1.3 GPa, depending on the raised height of the SiGe stresses. The stress increase is observed even if CESL 240 (FIG. 4) applies no compressive and tensile stresses.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate;
    a first MOS device comprising a first gate, wherein the first gate comprises:
        a first high-k dielectric over the semiconductor substrate;

a second high-k dielectric over the first high-k dielectric, wherein the first and the second high-k dielectrics comprise different materials;
a first metal layer over the second high-k dielectric, wherein the first metal layer has a thickness great enough for dominating a work-function of the first MOS device; and
a second metal layer over the first metal layer, wherein the first and the second metal layers comprise different materials; and
a polysilicon layer between the first metal layer and the second metal layer; and
a second MOS device comprising a second gate, wherein the second gate does not comprise any polysilicon layer, and wherein the second gate comprises:
a third high-k dielectric over the semiconductor substrate, wherein the third high-k dielectric comprises same materials as one of the first high-k dielectric and the second high-k dielectric, and have substantially a same thickness;
a third metal layer over the third high-k dielectric, wherein the third metal layer and the first metal layer comprise same materials, wherein a combined thickness of dielectric layers between the third metal layer and the semiconductor substrate is less than a combined thickness of dielectric layers between the first metal layer and the semiconductor substrate; and
a fourth metal layer over the third metal layer, wherein the third and the fourth metal layers comprise different materials, and the fourth metal layer further comprises a sixth metal layer having a thickness great enough for dominating a work function of the second MOS device, a barrier layer over the sixth metal layer; and a metal re-flow layer over the barrier layer, wherein the metal re-flow layer is configured to be re-flowable.

2. The semiconductor structure of claim 1, wherein the first MOS device is an NMOS device, and the second MOS device is a PMOS device.

3. The semiconductor structure of claim 1, wherein the first metal layer has a mid-gap work function, and wherein the fourth metal layer has a work function close to a valence band of silicon.

4. The semiconductor structure of claim 2, wherein the second high-k dielectric material comprises La, and wherein the second gate does not comprise any gate dielectric comprising La.

5. The semiconductor structure of claim 1, wherein the second gate further comprises a fifth metal layer between the third metal layer and the fourth metal layer, wherein the fifth metal layer has a thickness less than a thickness required for dominating a work function of the second MOS device, and wherein the fifth and the first metal layers comprise same materials.

6. The semiconductor structure of claim 1, wherein the second and the third metal layers have thicknesses less than a thickness required for dominating work functions of the first and the second MOS devices, respectively.

7. The semiconductor structure of claim 1, wherein the first gate further comprises a seventh metal layer over the second metal layer, and wherein the seventh metal layer comprises same materials as the fourth metal layer.

8. A semiconductor structure comprising:
a semiconductor substrate;
an NMOS device comprising a first gate, wherein the first gate comprises:
a first high-k dielectric over the semiconductor substrate;
a second high-k dielectric over the first high-k dielectric, wherein the first and the second high-k dielectrics comprise different materials;
a first metal layer over the second high-k dielectric, wherein the first metal layer has a thickness great enough for dominating a work-function of the NMOS device, and wherein the first metal layer has a mid-gap work function;
a second metal layer over the first metal layer; and
a third metal layer over the second metal layer, wherein the third metal layer has a work function close to a valence band of silicon; and
a PMOS device comprising a second gate, wherein the second gate comprises:
one of the first high-k dielectric and the second high-k dielectric over the semiconductor substrate, wherein the other of the first high-k dielectric and the second high-k dielectric being absent from the second gate;
the second metal layer over the first high-k dielectric, wherein the second metal layer in the second gate has a bottom surface lower than a bottom surface of the second metal layer in the first gate; and
the third metal layer over the second metal layer;
wherein the third metal layer further comprises a fourth metal layer having a thickness great enough for dominating a work function of the second MOS device, a barrier layer over the fourth metal layer; and a metal re-flow layer over the barrier layer, wherein the metal re-flow layer is configured to be re-flowable.

9. The semiconductor structure of claim 8, wherein the second gate further comprises an additional metal layer between the first high-k dielectric and the second metal layer, wherein the additional metal layer is formed of a same material as, and has a thickness less than, the first metal layer.

10. The semiconductor structure of claim 8, wherein the first gate further comprises a polysilicon layer between the first and the second metal layers, and wherein the second gate does not comprise any polysilicon layer.

11. The semiconductor structure of claim 8, wherein the first metal layer and the second metal layer are flat layers, and wherein the third metal layer comprises sub-layers comprising bottom portions and sidewall portions higher than the bottom portions.

12. The semiconductor structure of claim 8, wherein the first and the third metal layers have thicknesses of greater than about 3 nm, and the second metal layer has a thickness of less than about 2 nm.

13. The semiconductor structure of claim 8, wherein the second high-k dielectric comprises La, and has a thickness of between about 0.3 nm and about 3 nm, and wherein the second gate does not comprise any gate dielectric comprising La.

14. The semiconductor structure of claim 8, wherein the first metal layer comprises a material selected from the group consisting essentially of TaN, TiN, TaSiN, TiAlN, and combinations thereof.

15. The semiconductor structure of claim 8, wherein the third metal layer comprises a metal selected from the group consisting essentially of W, Ru, Mo, and combinations thereof.

16. A semiconductor structure comprising:
a semiconductor substrate;
a first high-k dielectric over the semiconductor substrate;

a second high-k dielectric over the first high-k dielectric, wherein the first and the second high-k dielectrics comprise different materials;
a first metal layer over the second high-k dielectric, wherein the first metal layer has a mid-gap work function;
a polysilicon layer over the first metal layer;
a second metal layer over the polysilicon layer; and
a third metal over the second metal layer, the third metal layer further comprising a fourth metal layer with a work function close to a valence band of silicon, a barrier layer over the fourth metal layer; and a metal re-flow layer over the barrier layer, wherein the metal re-flow layer is configured to be re-flowable.

17. The semiconductor structure of claim 16, wherein the first metal layer is flat, and wherein the second metal layer comprises sub-layers comprising bottom portions, and sidewall portions extending above the bottom portions.

\* \* \* \* \*

UNITED STATES PATENT AND TRADEMARK OFFICE
CERTIFICATE OF CORRECTION

| | | |
|---|---|---|
| PATENT NO. | : 8,536,660 B2 | Page 1 of 1 |
| APPLICATION NO. | : 12/047113 | |
| DATED | : September 17, 2013 | |
| INVENTOR(S) | : Peng-Fu Hsu et al. | |

It is certified that error appears in the above-identified patent and that said Letters Patent is hereby corrected as shown below:

In the Specification

Col. 5, lines 18-19: Insert the word --or-- between the words "oxide" and "a silicate".

Signed and Sealed this
Seventeenth Day of November, 2015

Michelle K. Lee
*Director of the United States Patent and Trademark Office*